United States Patent [19]
Stewart

[11] Patent Number: 6,104,210
[45] Date of Patent: Aug. 15, 2000

[54] METHOD FOR AVOIDING BUS CONTENTION IN A DIGITAL CIRCUIT

[75] Inventor: William K. Stewart, Lexington, Mass.

[73] Assignee: Ikos Systems, Inc., Cupertino, Calif.

[21] Appl. No.: 08/807,298

[22] Filed: Feb. 27, 1997

[51] Int. Cl.[7] .............................................. H03K 19/0175
[52] U.S. Cl. ............................. 326/86; 326/90; 326/82; 326/21
[58] Field of Search .................................. 326/82, 86, 90, 326/21, 30

[56] References Cited

U.S. PATENT DOCUMENTS

| | | | |
|---|---|---|---|
| 4,766,334 | 8/1988 | Warner | 326/30 |
| 5,146,563 | 9/1992 | Donaldson et al. | 395/250 |
| 5,225,723 | 7/1993 | Drako et al. | 326/86 |
| 5,668,482 | 9/1997 | Roskell | 326/17 |

FOREIGN PATENT DOCUMENTS 404319815  11/1992  Japan ..................................... 326/86

*Primary Examiner*—Michael Tokar
*Assistant Examiner*—Daniel D. Chang
*Attorney, Agent, or Firm*—Skjerven, Morrill, MacPherson, Franklin & Friel LLP; Edward C. Kwok

[57] ABSTRACT

In a digital circuit, a method for avoiding a bus contention condition which results from an overlap of active phases of multiple bus drivers. The method avoids such bus contention condition by including holding amplifiers in the data bus and by turning on respective bus drivers only for durations sufficient to establish a data value on the data bus.

7 Claims, 2 Drawing Sheets

METHOD FOR AVOIDING BUS CONTENTION IN A DIGITAL CIRCUIT

BACKGROUND OF THE INVENTION

1. Field of the Invention

The present invention relates to digital circuits design tools. In particular, the present invention relates to a design method in avoiding bus contention in a digital circuits.

2. Discussion of the Related Art

In a digital circuit, a frequently used bidirectional connection, referred to as a "bus", is shared by two or more devices for data transfer. In such a digital circuit the bus is typically shared synchronously, with each device being granted the use of the bus for the duration of a period of a clock signal. Ideally, a data bus driver granted the use of the bus would drive its data onto the bus through the end of the clock period, so as to allow the data to be latched at the beginning of the next clock period. Clearly, to achieve high performance, the bus should be available to the connected devices every clock period. Practically, however, a transient contention condition can occur when two devices drive the bus during successive clock periods, as illustrated below with reference to FIGS. 1a and 1b. As shown in FIG. 1a, a data bus 100 in the prior art is driven by two sets of data bus drivers 101 and 102, which are controlled by enable signals ENABLE_A and ENABLE_B at control terminals 103 and 104 respectively. Data bus drivers 101 and 102 drive data signals A and data signals B onto data bus 100. FIG. 1b is a timing diagram showing a clock signal CLOCK, signals ENABLE_A and ENABLE_B and the data signals, i.e. data signals A and data signal B, on data bus 100.

As shown in FIG. 1b, data signals A and data signals B are allocated the use of data bus 100 during periods 105 ("A cycle") and 106 ("B cycle") of clock signal CLOCK respectively. During the A cycle, at time $t_1$, data signals A are ready and enable signal ENABLE_A turns on data bus driver 101 to place data signals A onto data bus 100. Likewise, during the B cycle, at time $t_2$, data signals B are ready and enable signal ENABLE_B turns on data bus driver 101 to place data signals B onto data bus 100. Signal DATA of FIG. 1b is a timing representation of the placements of the data values onto bus 100. As shown in FIG. 1b, because of the different delay characteristics of the circuits generating enable signals ENABLE_A and ENABLE_B, the active periods of enable signals ENABLE_A and ENABLE_B overlaps (i.e. enable signal ENABLE_A remains active until time $t_3$, after enable signal ENABLE_B has become active) whenever a B cycle follows an A cycle. Consequently, contention on data bus 100 occurs during time period ($t_2$, $t_3$), i.e. the overlap period during which enable signal ENABLE_B becomes active and enable signal ENABLE_A becomes inactive. Such contention is unacceptable if physical damage is caused to the bus drivers, or if data is read from the data bus during the overlap period (i.e. time interval ($t_2$, $t_3$)), thereby causing an integrity problem elsewhere in the digital system. In fact, even if enable signal ENABLE_A becomes inactive at time $t_2$, i.e., coincidentally with enable signal ENABLE_B becoming active, variations in the delays of bus drivers 101 and 102 may still cause the bus contention problem described above.

Because of their complexities, which make computer simulations impractical, modern digital circuits are often verified and debugged using a hardware emulation system. A hardware emulation system implements a digital circuit on a programmable circuit board, using generic programmable logic integrated circuits, e.g. field programmable gate arrays (FPGAs), as surrogates. Typically, while allowing different portions of the digital circuit to be analyzed using both the hardware and the software of the emulation system, such an implementation are necessarily clocked at a reduced speed. As a result, some delay characteristics (e.g. tri-state bus turn-off times) can be ten or more times worse in the emulation circuit than in the actual target implementation. Thus, even if the target implementation is designed such that the bus contention has a tolerable duration, an unacceptable or destructive bus contention condition may occur in the emulation circuit.

In the prior art, to allow the logic circuit under design to be emulated, one way to avoid a destructive bus contention condition is to require that a "dead" cycle (i.e. a clock period during which the data bus is not used or "idled") to be inserted whenever a B cycle follows an A cycle. However, such a requirement clearly degrades system performance by introducing into the digital circuit an unnecessary delay of a clock period for each dead cycle. Alternatively, a destructive bus contention condition is avoided by redesigning the logic circuit, so that bus driver 101 turns off sooner, or bus driver 102 turns on later, relative to the beginning of the B cycle. Such a redesign is not always practical, and in fact undesirable, if the bus contention is unacceptable only in the emulation circuit, but not in the target implementation.

SUMMARY OF THE INVENTION

The present invention provides a method for designing a data bus without a bus contention condition The present invention comprises the steps of (i) providing for each bit of the data bus a first bus driver controlled by a first control signal; (ii) providing for each bit of the data bus a second bus driver controlled by a second control signal; (iv) including for each bit of the data bus a holding amplifier, which maintains a data value of the bit, when neither the first bus driver nor the second bus driver is active; and (iv) activating a selected one of the first bus driver and the second bus driver for a predetermined duration sufficient to place a data value on the bit of the data bus, by controlling an active phase of a corresponding one of the first and second control signals. In one embodiment, the holding amplifier includes a signal buffer and a feedback resistive element.

By using holding amplifiers to maintain the data values on a data bus, an data bus driver on the data bus need not remain active through the end of an allocated bus cycle, thus avoiding an overlap period in which more than one bus drivers are turned on, thereby avoiding a bus contention condition.

The present invention is better understood upon the consideration of the detailed description bellow in conjunction with the accompanying drawings.

BRIEF DESCRIPTION OF THE DRAWINGS

FIG. 1b is a timing diagram showing a clock signal CLOCK, signals A and B and a timing representation of the placements of the data signals A and data signal B onto data bus 100 of FIG. 1a.

FIG. 2b is a timing diagram showing a clock signal CLOCK, signals ENABLE_A' and ENABLE_B' and a timing representation of the placements of data signals A and data signal B onto data bus 200 of FIG. 2a.

DETAILED DESCRIPTION OF THE PREFERRED EMBODIMENTS

Figure 1A:
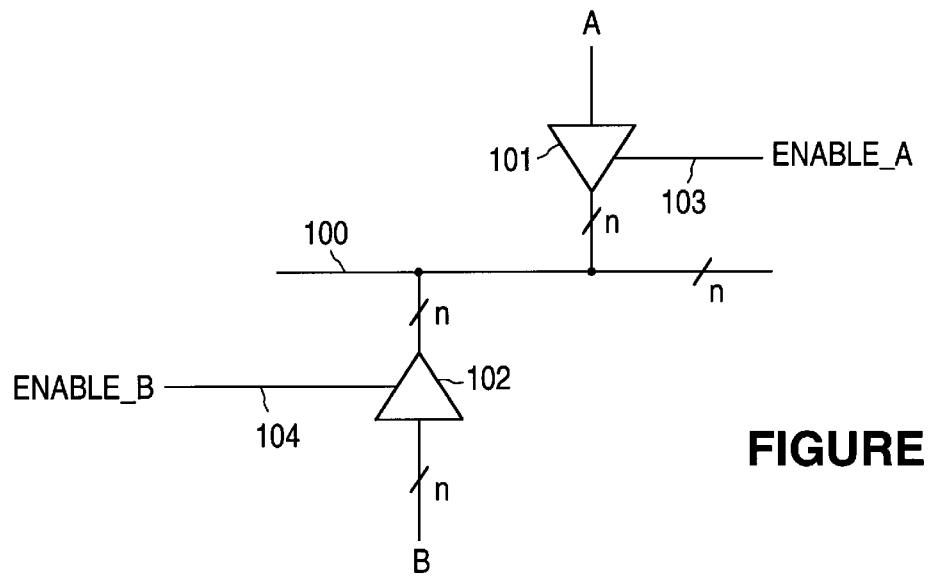
FIG. 1a shows a data bus 100 in the prior art driven by two sets of data bus drivers 101 and 102, controlled by enable signals ENABLE_A and ENABLE_B respectively.
Figure 2A:
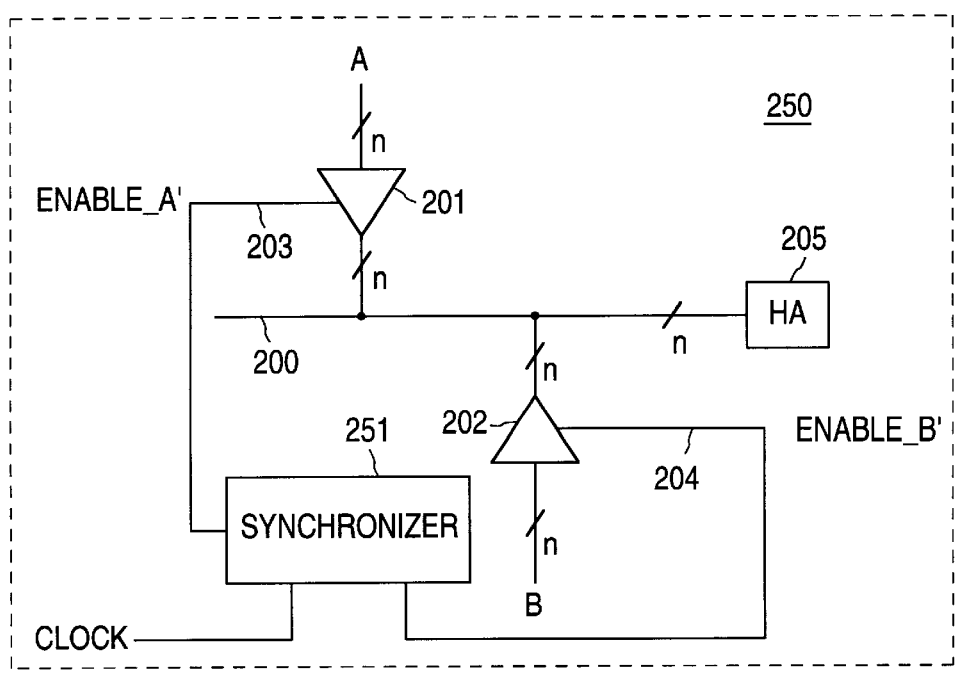
FIG. 2a shows a data bus 200 in accordance with the present invention, driven by two sets of data bus drivers 201 and 202, controlled by enable signals ENABLE_A' and ENABLE_B' respectively.
Figure 2B:
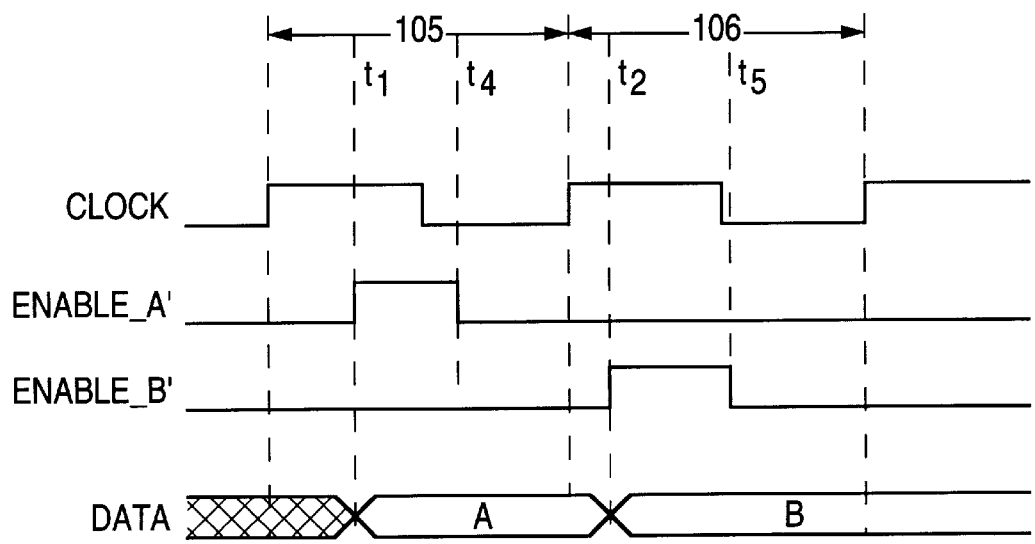

The present invention eliminates bus contention without introducing performance-degrading dead cycles, or requiring faster bus driver turn-offs. One embodiment of the present invention is illustrated in conjunction with FIGS. 2a and 2b. As shown in FIG. 2a, a data bus 200 is driven by two sets of data bus drivers 201 and 202, which are controlled by enable signals ENABLE_A' and ENABLE_B' at control terminals 203 and 204 respectively. Data bus drivers 201 and 202 drive data signals A and data signals B onto data bus 200 Unlike data bus 100 of FIG. 1a, however, data bus 200 is provided with a set of holding amplifiers 205, which maintain the data value on bus 200, even when neither one of bus drivers 201 and 202 is turned on. FIG. 2b is a timing diagram showing a clock signal CLOCK, signals ENABLE_A' and ENABLE_B' and a timing representation of the placements of data signals A and data signal B onto data bus 200. Synchronizer 251 schematically represents circuitry providing the timing relationship among signals "Clock", Enable_A'" and "Enable_B'" shown in FIG. 2b. This embodiment of the present invention is applicable to an emulation system, which is indicated by reference numeral 250.

Figure 1B:
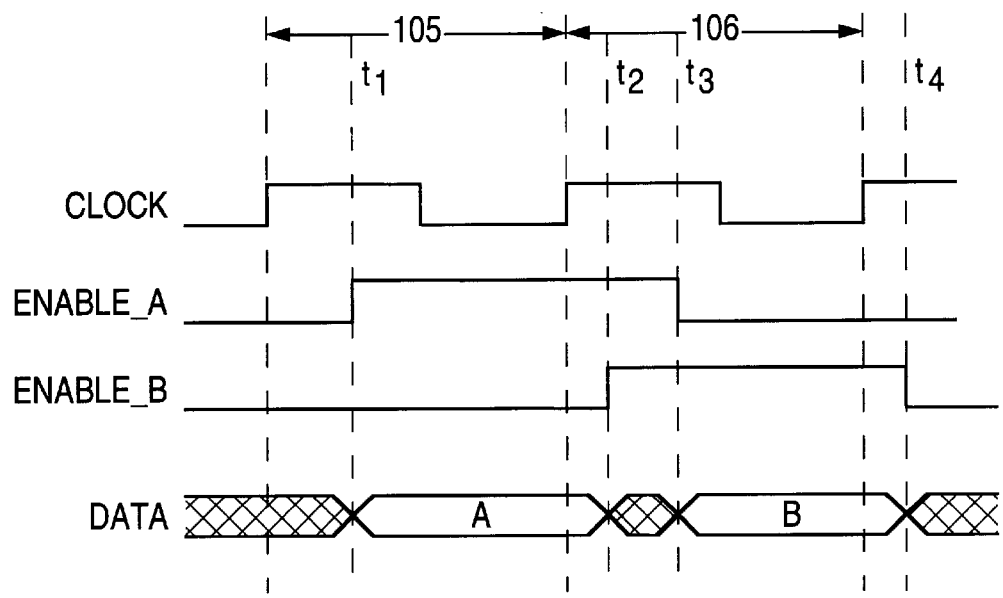

As shown in FIG. 2b, as in FIG. 1b, data signals A and data signals B are allocated the use of data bus 200 during periods 105 ("A cycle") and 106 ("B cycle") of clock signal CLOCK respectively. However, with the use of holding amplifiers 205, enable signal ENABLE_A' need only remain active long enough to ensure data signals A are established on data bus 200. This active period of enable signal ENABLE_A' is illustrated in FIG. 2b by the time interval ($t_1$, $t_4$). Likewise, during the B cycle, at time $t_2$, enable signal ENABLE_B' need only remain active over a time interval ($t_2$, $t_5$) i.e. until bus drivers 201 places data signals B onto data bus 200. In FIG. 2b, signal DATA represents the data values on bus 200. Once a set of data signals are established on data bus 200, the data values of these data signals are held by holding amplifiers 205 until another set of data signals are established in data bus 200. Thus, as shown in FIG. 2b, the data values of A and B are placed on bus 200 when their respective enable signals ENABLE_A' and ENABLE_B' become active, without a period of bus contention.

Figure 3:
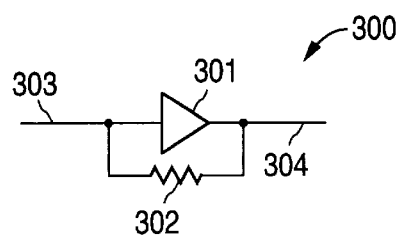
FIG. 3 shows a holding amplifier 300, including an amplifier 301 and a resistive element 302.

An example of a holding amplifier 300 for a single bit is shown in FIG. 3. (For a 32-bit bus, thirty-two such holding amplifier would be provided). As shown in FIG. 3, holding amplifier 300 includes an signal buffer or amplifier 301 and a resistive element 302. When a data value is placed by a bus driver (not shown) onto terminal 303, amplifier 301 drives the data value onto terminal 304. The data value at terminal 304 is fed-back by resistive element 302 onto terminal 303. Consequently, even if the bus driver is tristated subsequently, the data value at terminal 303 is maintained by holding amplifier 300 until a bus driver places a data value onto terminal 303. Holding amplifiers have been included in busses previously to prevent a floating bus condition, which may result when all the bus drivers of a data bus are tristated. A floating bus is undesirable from the points of view of power dissipation, heat production and reliability. The holding amplifiers maintain the last set of data values on the data bus.

The above detailed description is provided to illustrate the specific embodiments of the present invention and is not intended to be limiting. Numerous variations and modifications within the scope of the present invention are possible. For examples even though the embodiments of the present invention is described above, using examples in hardware emulation circuits, the present invention is generally applicable to digital circuits with a tristated bus. The present invention is set forth in the following claims.

I claim:

1. In a digital circuit, a method for avoiding contention in a data bus, comprising the steps of:

providing a clock signal;

providing for each bit of said data bus a first bus driver controlled by a first control signal synchronized to said clock signal;

providing for each bit of said data bus a second bus driver controlled by a second control signal synchronized to said clock signal;

including for each bit of said data bus a holding amplifier, said holding amplifier maintaining a data value of said bit, when neither said first bus driver nor said second bus driver is active; and activating a selected one of said first bus driver and said second bus driver for a predetermined duration after the beginning of a phase of said clock signal to place a data value on said bit of said data bus by controlling an active phase of a corresponding one of said first and second control signals, said predetermined duration being shorter than the duration of said phase of said clock signal.

2. A method as in claim 1, wherein said holding amplifier comprises an amplifier and a resistive element.

3. A method as in claim 1, wherein said method is implemented in an emulation system including field programmable logic devices.

4. A contention-free data bus synchronized to a clock signal, comprising:

a first plurality of bus drivers providing data bits on said data bus when enabled by an active phase of a first control signal, said active phase of said first control signal having a predetermined duration shorter than a phase of said clock signal and synchronized to the beginning of said phase of said clock signal;

a second plurality of bus drivers providing data bits on said data bus when enabled by an active phase of a second control signal, said active phase of said second control signal having a predetermined duration shorter than a phase of said clock signal and synchronized to the beginning of said phase of said clock signal; and for each data bit of said data bus, a holding amplifier, said holding amplifier maintaining a data value of said bit, when neither said first bus drivers nor said second bus drivers are active.

5. A contention-free data bus as in claim 4, wherein said active phase of said first control signal and said active phase of said control signal being non-overlapping in time.

6. A contention-free data bus as in claim 4, wherein said holding amplifier comprises an amplifier and a resistive element.

7. A contention-free data bus as in claim 4, wherein said contention-free data bus is implemented in an emulation system including field programmable logic devices.

* * * * *